(12) United States Patent
Chang

(10) Patent No.: US 12,125,735 B2
(45) Date of Patent: Oct. 22, 2024

(54) METHOD FOR SELECTIVELY RELEASING A LIGHT-EMITTING DIODE CHIP AND METHOD OF MANUFACTURING LIGHT-EMITTING DEVICE

(71) Applicant: ASTI GLOBAL INC., TAIWAN, Taichung (TW)

(72) Inventor: Te-Fu Chang, Taichung (TW)

(73) Assignee: ASTI GLOBAL INC., TAIWAN, Taichung (TW)

( * ) Notice: Subject to any disclaimer, the term of this patent is extended or adjusted under 35 U.S.C. 154(b) by 400 days.

(21) Appl. No.: 17/568,742

(22) Filed: Jan. 5, 2022

(65) Prior Publication Data

US 2022/0285198 A1 Sep. 8, 2022

(30) Foreign Application Priority Data

Mar. 8, 2021 (TW) ................................. 110108149

(51) Int. Cl.
*H01L 21/683* (2006.01)
*H01L 25/075* (2006.01)
*H01L 33/62* (2010.01)

(52) U.S. Cl.
CPC ...... *H01L 21/6835* (2013.01); *H01L 25/0753* (2013.01); *H01L 33/62* (2013.01); *H01L 2221/68354* (2013.01); *H01L 2221/68363* (2013.01); *H01L 2221/68381* (2013.01); *H01L 2933/0066* (2013.01)

(58) Field of Classification Search
CPC ............... H01L 21/6835; H01L 21/683; H01L 21/67115; H01L 21/67; H01L 21/67144; H01L 25/0753; H01L 25/075; H01L 25/115; H01L 33/0095; H01L 33/00; H01L 33/62; H01L 2221/68354; H01L 2221/68363; H01L 2221/68381; H01L 2221/68322; H01L 2933/0066; H01L 2933/0008; H01L 2933/0033
See application file for complete search history.

(56) References Cited

U.S. PATENT DOCUMENTS 11,380,816 B2 * 7/2022 Henley ............... H01L 21/6835
2020/0194616 A1 * 6/2020 Henley ................... H01L 22/14

FOREIGN PATENT DOCUMENTS

| CN | 109599463 A | 4/2019 |
|---|---|---|
| TW | 201909379 A | 3/2019 |

* cited by examiner

*Primary Examiner* — Nikolay K Yushin

(57) ABSTRACT

A method of releasing a selected light-emitting diode chip from a plurality of light-emitting diode chips each of which has a p-type electrode, an n-type electrode and a central portion between the p-type electrode and the n-type electrode, comprising steps of: providing a first substrate with the plurality of light-emitting diode chips bonded thereon and spaced from each other in a pitch; and applying a laser spot generated from a laser energy source to reduce a bonding force between the selected light-emitting diode chip and the first substrate, thereby making the selected light-emitting diode chip release from the first substrate; wherein the laser spot has a coverage over the p-type electrode and the n-type electrode of the selected light-emitting diode chip, and the coverage has a length less than the pitch.

2 Claims, 6 Drawing Sheets

```
┌─────────────────────────────────────────────────────────┐
│ providing a first substrate with the plurality of light-emitting │
│ diode chips bonded thereon and spaced from each other in         │ ～ S1
│ a pitch                                                          │
└─────────────────────────────────────────────────────────┘
                            │
                            ▼
┌─────────────────────────────────────────────────────────┐
│ applying a laser spot generated from a laser energy source to    │
│ reduce a bonding force between the selected light-emitting       │
│ diode chip and the first substrate, thereby making the selected  │
│ light-emitting diode chip release from the first substrate;      │ ～ S2
│ wherein the laser spot has a coverage over the p-type            │
│ electrode and the n-type electrode of the selected light-emitting│
│ diode chip, and the coverage has a length less than the pitch    │
└─────────────────────────────────────────────────────────┘
```

FIG.1

METHOD FOR SELECTIVELY RELEASING A LIGHT-EMITTING DIODE CHIP AND METHOD OF MANUFACTURING LIGHT-EMITTING DEVICE

CROSS-REFERENCE TO RELATED APPLICATION

This non-provisional application claims priority under 35 U.S.C. § 119(a) on Patent Application No(s). 110108149 filed in Taiwan, R.O.C. on Mar. 8, 2021, the entire contents of which are hereby incorporated by reference.

BACKGROUND OF THE INVENTION

1. Field of the Invention

The present disclosure relates to a method of selectively releasing a light-emitting diode chip, and in particular to a method of selectively releasing a light-emitting diode chip by applying a laser spot generated from a laser energy source. The present disclosure further relates to a method of manufacturing a light-emitting device.

2. Description of the Related Art

Owing to technological advancement and ever-increasing consumer needs, various electronic devices come with increasingly complicated functions and each require an increasingly large number of electronic components. The trend toward miniaturization of the electronic components is intended to reduce their unrequired volume and effectively enhance their performance.

For example, over past years novel display units have evolved into various forms, such as light-emitting diode (LED) display devices. However, light-emitting diode display devices have a trend toward arranging microscale light-emitting diode chips in an array with a view to meeting the need for high resolution.

Selectively releasing a light-emitting diode chip is an important technique for use in a process of manufacturing light-emitting diode display devices. For example, radiant energy, such as laser, is selectively applied onto a selected light-emitting diode chip to overcome a bonding force between the selected light-emitting diode chip and a substrate, thereby allowing the selected light-emitting diode chip to separate from the substrate.

However, there is still room for improvement in conventional techniques of selectively releasing a light-emitting diode chip in terms of precision and efficiency. Therefore, it is important to provide a technique of releasing a selected light-emitting diode chip quickly and precisely.

BRIEF SUMMARY OF THE INVENTION

To overcome the drawbacks of conventional methods of selectively releasing a light-emitting diode chip in terms of precision and efficiency, the present disclosure provides a method of selectively releasing a light-emitting diode chip and a method of manufacturing a light-emitting device.

In order to achieve the above and other objectives, the present disclosure provides a method of releasing a selected light-emitting diode chip from a plurality of light-emitting diode chips each of which has a p-type electrode, an n-type electrode and a central portion between the p-type electrode and the n-type electrode, comprising steps of:

providing a first substrate with the plurality of light-emitting diode chips bonded thereon and spaced from each other in a pitch; and applying a laser spot generated from a laser energy source to reduce a bonding force between the selected light-emitting diode chip and the first substrate, thereby making the selected light-emitting diode chip release from the first substrate;

wherein the laser spot has a coverage over the p-type electrode and the n-type electrode of the selected light-emitting diode chip, and the coverage has a length less than the pitch.

Regarding the method, the length of the coverage of the laser spot is less than a width of the selected light-emitting diode chip.

Regarding the method, the laser spot is applied onto the first substrate at a place corresponding to the selected light-emitting diode chip.

Regarding the method, the laser spot is applied onto the selected light-emitting diode chip.

Regarding the method, the laser spot is in a form of two spots.

Regarding the method, the two spots cover the p-type electrode and the n-type electrode of the selected light-emitting diode chip, respectively.

Regarding the method, the laser spot is in a form of three spots.

Regarding the method, the three spots cover the p-type electrode, the n-type electrode and the central portion of the selected light-emitting diode chip, respectively.

In order to achieve the above and other objectives, the present disclosure provides a method of manufacturing a light-emitting device, comprising steps of:

releasing the selected light-emitting diode chip from the first substrate according to the method aforementioned; and transferring the selected light-emitting diode chip thus released onto a second substrate.

A method of selectively releasing a light-emitting diode chip according to the present disclosure is effective in releasing a selected light-emitting diode chip quickly and precisely through a coverage of a specific laser spot. The present disclosure further provides a method of manufacturing a light-emitting device to precisely release, with the method of selectively releasing a light-emitting diode chip, a selected light-emitting diode chip precisely during a production and/or repair process in the course of manufacturing the light-emitting device, so as to enhance the efficiency of manufacturing the light-emitting device.

BRIEF DESCRIPTION OF THE DRAWINGS

FIG. 1 is a schematic view of a process flow of a method of selectively releasing a light-emitting diode chip according to embodiment 1 of the present disclosure.

DETAILED DESCRIPTION OF THE INVENTION

Figure 2:
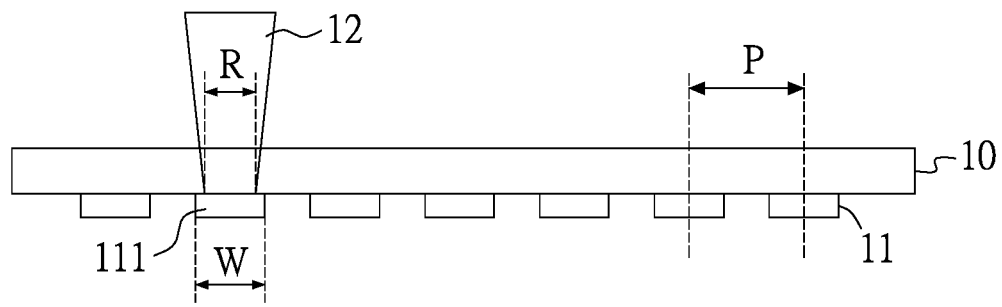
FIG. 2 is a cross-sectional view of how to carry out the method of selectively releasing a light-emitting diode chip according to embodiment 1 of the present disclosure.

The following are specific embodiments to illustrate the implementation of the present invention. Persons skilled in the art can understand the other advantages and effects of the present invention from the content disclosed in this specification. The present invention can also be implemented or applied by other different specific embodiments, and various details in this specification can also be based on different viewpoints and applications, and various modifications and changes can be made without departing from the spirit of the present invention.

The term "pitch" used hereunder means the distance between the geometric center of a light-emitting diode chip and the geometric center of another adjacent light-emitting diode chip.

The laser spot disclosed hereunder is in a form of a single spot or multiple spots. The laser spot is generated from a Gaussian beam; in this situation, a coverage of the laser spot means a circle defined by points wherein an magnitude of an electromagnetic field dropped to $1/e^2$ of the magnitude of the electromagnetic field in axial direction.

When the light-emitting diode chip disclosed hereunder has a quadrangular outline, the width of the light-emitting diode chip means the length of the longer sides of the light-emitting diode chip; for example, when the light-emitting diode chip has a rectangular outline, the width of the light-emitting diode chip means the length of the longer sides of the rectangular outline of the light-emitting diode chip. When the light-emitting diode chip has a square outline, the width of the light-emitting diode chip means the length of each side of the square outline of the light-emitting diode chip. In addition, when the light-emitting diode chip has a circular outline, the width of the light-emitting diode chip means the diameter of the circular outline of the light-emitting diode chip. But the present disclosure is not limited thereto.

The "manufacturing" in the method of manufacturing a light-emitting device includes a "production" and/or "repair" process.

Embodiment 1

As shown in FIG. 1, embodiment 1 of the present disclosure provides a method of selectively releasing a selected light-emitting diode chip from a plurality of light-emitting diode chips each of which has a p-type electrode, an n-type electrode and a central portion between the p-type electrode and the n-type electrode. The method comprises the steps of: providing a first substrate with the plurality of light-emitting diode chips bonded thereon and spaced from each other in a pitch (step S1); and applying a laser spot generated from a laser energy source to reduce a bonding force between the selected light-emitting diode chip and the first substrate, thereby making the selected light-emitting diode chip release from the first substrate; wherein the laser spot has a coverage over the p-type electrode and the n-type electrode of the selected light-emitting diode chip, and the coverage has a length less than the pitch (step S2). Thus, the method of selectively releasing a light-emitting diode chip according to embodiment 1 is effective in releasing a selected light-emitting diode chip quickly and precisely through a coverage of a specific laser spot.

Figure 3:
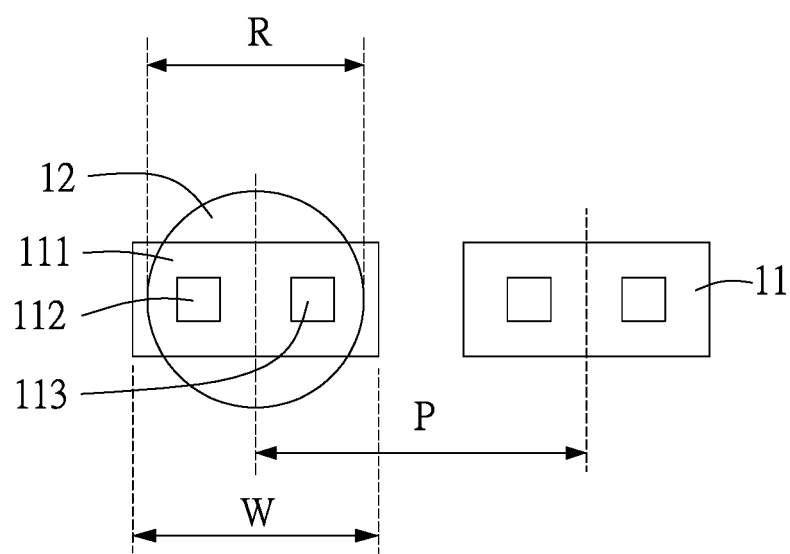
FIG. 3 is a schematic view of a coverage of a laser spot for use in the method of selectively releasing a light-emitting diode chip according to embodiment 1 of the present disclosure.

As shown in FIG. 2 and FIG. 3, step S1 involves providing a first substrate 10. A plurality of light-emitting diode chips 11 are bonded onto the first substrate 10 and spaced from each other in a pitch P.

As shown in FIG. 2 and FIG. 3, step S2 involves applying a laser spot 12 generated from a laser energy source to reduce a bonding force between the selected light-emitting diode chip 111 and the first substrate 10, thereby releasing the selected light-emitting diode chip 111 from the first substrate 10. The laser spot 12 has a coverage over a p-type electrode 112 and an n-type electrode 113 of the selected light-emitting diode chip 111. The coverage has a length R less than the pitch P.

In embodiment 1, the coverage of the laser spot 12 is less than the width W of the selected light-emitting diode chip 111. The laser spot is applied onto the first substrate at a place corresponding to the selected light-emitting diode chip. The step of applying the laser spot onto the first substrate at a place corresponding to the selected light-emitting diode chip is illustrative rather than restrictive of a preferred embodiment of the present disclosure. In another embodiment, the coverage of the laser spot 12 can be greater than the width W of the selected light-emitting diode chip 111, provided that the coverage of the laser spot 12 has a length R less than the pitch P and covers the p-type electrode 112 and n-type electrode 113 of the selected light-emitting diode chip 111.

FIG. 2 and FIG. 3 schematically show a selected light-emitting diode chip 111. However, persons skilled in the art understand that a plurality of light-emitting diode chips are selected as needed and released. In an embodiment, the laser spot having the coverage is sequentially applied to the selected light-emitting diode chips to sequentially release the selected light-emitting diode chips. In another embodiment, a plurality of laser spots are simultaneously applied to the selected light-emitting diode chips to simultaneously release the selected light-emitting diode chips, wherein the plurality of laser spots either originate from the same emission source and are then split to effectuate their formation or originate from multiple emission sources.

Embodiment 2

The method of selectively releasing a light-emitting diode chip according to embodiment 2 differs from the method of selectively releasing a light-emitting diode chip according to embodiment 1 only in terms of the form of the laser spot. Thus, the similarity between embodiment 1 and embodiment 2 are omitted for brevity.

Figure 4:
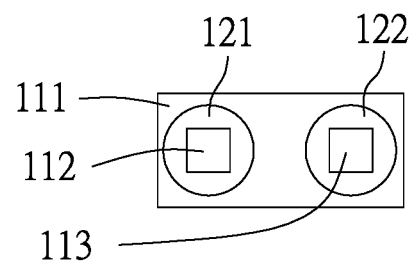
FIG. 4 is a schematic view of a coverage of a laser spot for use in the method of selectively releasing a light-emitting diode chip according to embodiment 2 of the present disclosure.

As shown in FIG. 4, in embodiment 2 of the present disclosure, the laser spot is in a form of two spots 121, 122. The two spots 121, 122 cover the p-type electrode 112 and the n-type electrode 113 of the selected light-emitting diode chip 111, respectively.

Unlike its counterpart in embodiment 1, the laser spot in embodiment 2 is in a form of two spots 121, 122 conducive to miniaturization of the coverage of the laser spot, reduction of energy consumption, and quick, precise release of the selected light-emitting diode chip 111.

Embodiment 3

The method of selectively releasing a light-emitting diode chip according to embodiment 3 differs from the method of selectively releasing a light-emitting diode chip according to embodiment 1 only in terms of the form of the laser spot. Thus, the similarity between embodiment 1 and embodiment 3 are omitted for brevity.

Figure 5:
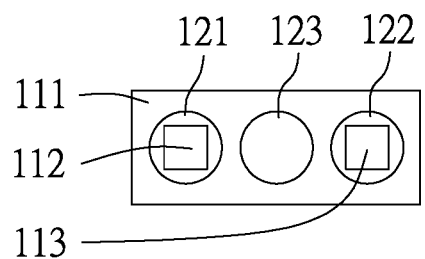
FIG. 5 is a schematic view of a coverage of a laser spot for use in the method of selectively releasing a light-emitting diode chip according to embodiment 3 of the present disclosure.

As shown in FIG. 5, in embodiment 3 of the present disclosure, the laser spot is in a form of three spots 121, 122, 123. The three spots 121, 122, 123 cover the p-type electrode 112, the n-type electrode 113, and the central portion of the selected light-emitting diode chip 111, respectively.

Unlike its counterpart in embodiment 2, the laser spot in embodiment 3 is in a form of three spots 121, 122, 123, and the spot 123 covers the central portion of the selected light-emitting diode chip 111. Thus, in embodiment 3, the laser spot is also applied to the central portion of the selected light-emitting diode chip 111, so as to ensure that the selected light-emitting diode chip 111 is released quickly and precisely.

Embodiment 4

A method of manufacturing a light-emitting device according to embodiment 4 comprises the step of transferring, with the method of embodiment 1, a selected red diode chip 111a, a selected green diode chip 111b, and a selected blue diode chip 111c repeatedly and sequentially to a second substrate 13 with a built-in circuit. In another embodiment, a selected light-emitting diode chip is transferred to another second substrate without any built-in circuit, using the method of embodiment 1.

Figure 6:
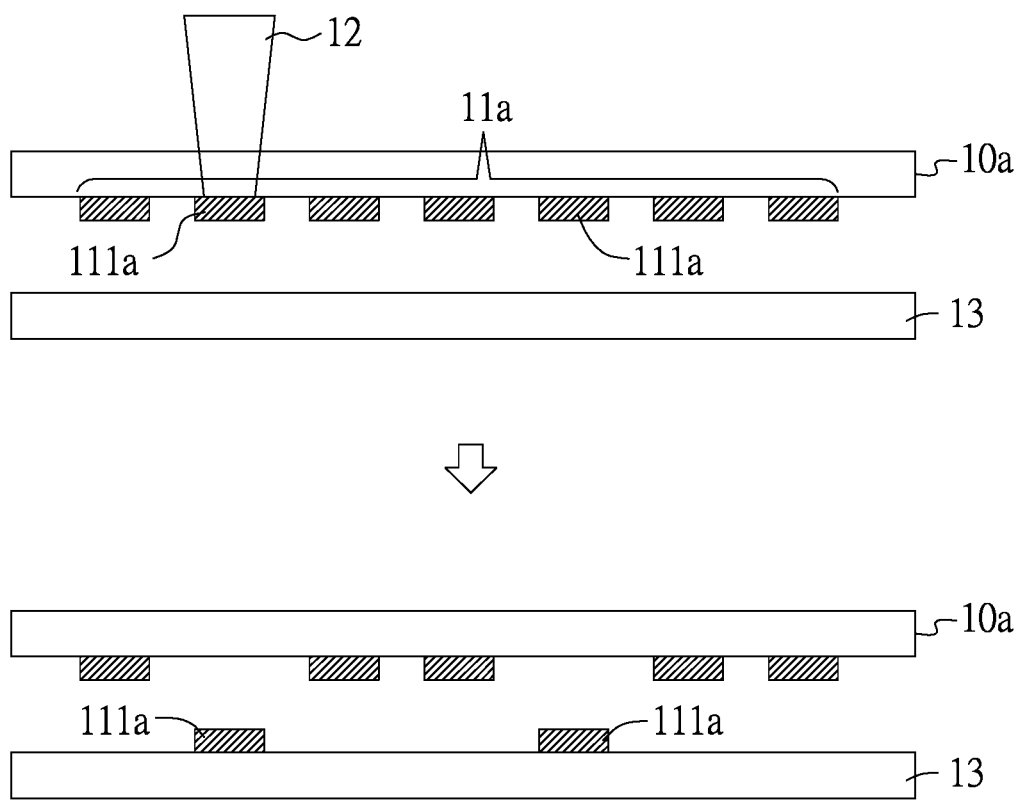
FIG. 6 is a cross-sectional view of how to carry out a method of manufacturing a light-emitting device according to embodiment 4 of the present disclosure.

As shown in FIG. 6, the second substrate 13 with a built-in circuit is horizontally placed below a red diode substrate 10a. A plurality of red diode chips 11a are bonded to a surface of the red diode substrate 10a. The red diode substrate 10a functions as the first substrate of embodiment 1. Next, a laser spot 12 generated from a laser energy source is applied in order to reduce a bonding force between the selected red diode chip 111a and the surface of the red diode substrate 10a, so as for the selected red diode chip 111a to be released from the red diode substrate 10a and transferred to the second substrate 13 with a built-in circuit.

Figure 7:
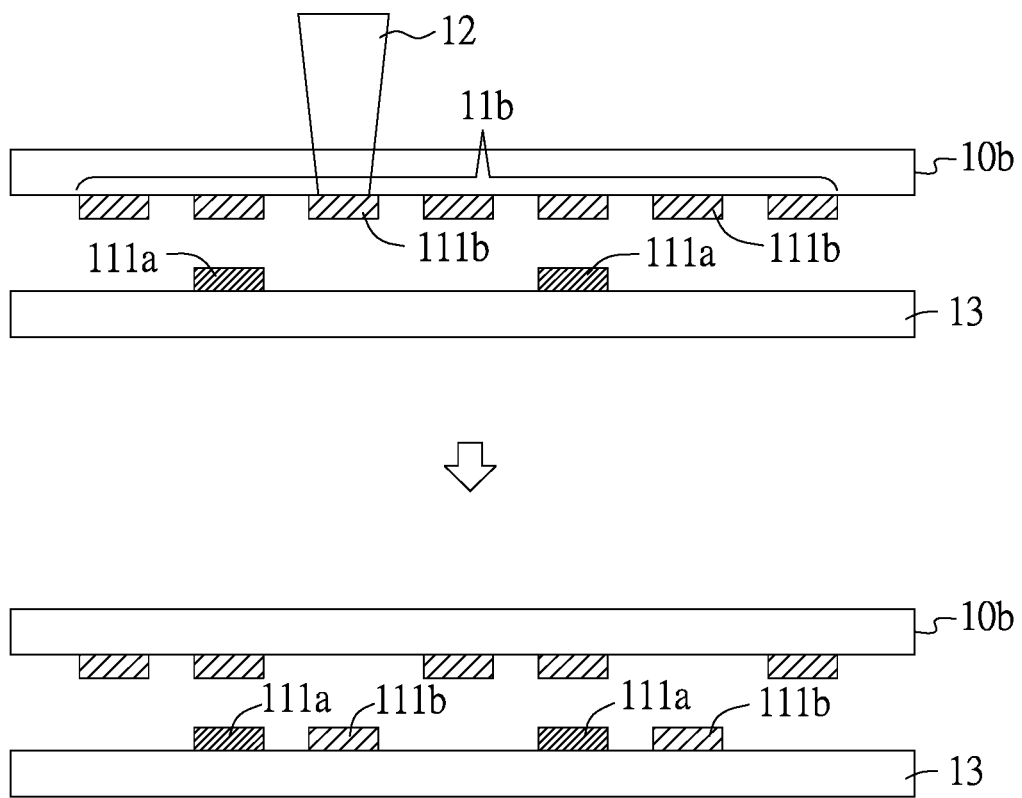
FIG. 7 is another cross-sectional view of how to carry out the method of manufacturing a light-emitting device according to embodiment 4 of the present disclosure.

As shown in FIG. 7, the second substrate 13 with a built-in circuit is horizontally placed below a green diode substrate 10b. A plurality of green diode chips 11b are bonded to a surface of the green diode substrate 10b. The green diode substrate 10b functions as the first substrate of embodiment 1. After that, a laser spot 12 generated from a laser energy source is applied in order to reduce a bonding force between the selected green diode chip 111b and the surface of the green diode substrate 10b, so as for the selected green diode chip 111b to be released from the green diode substrate 10b and transferred to the second substrate 13 with a built-in circuit. Referring to FIG. 6 and FIG. 7, the selected red diode chip 111a and the selected green diode chip 111b are spaced apart from each other, such that the selected red diode chip 111a and the selected green diode chip 111b are sequentially arranged on the second substrate 13.

Figure 8:
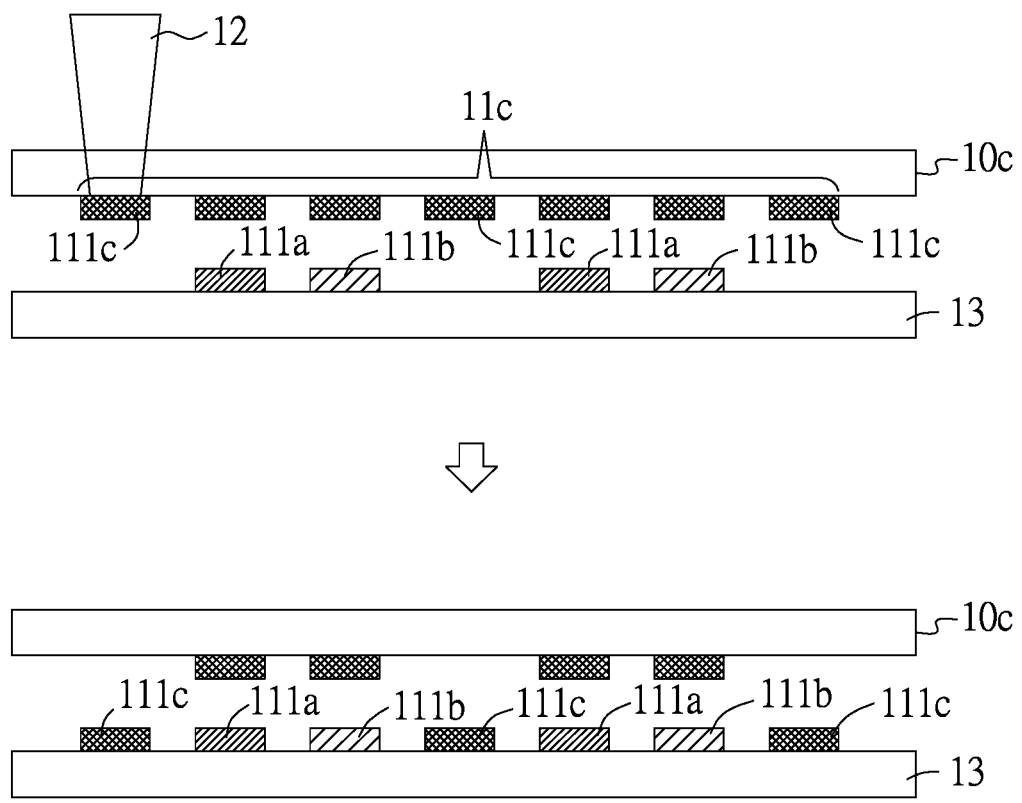
FIG. 8 is yet another cross-sectional view of how to carry out the method of manufacturing a light-emitting device according to embodiment 4 of the present disclosure.

As shown in FIG. 8, the second substrate 13 with a built-in circuit is horizontally placed below a blue diode substrate 10c. A plurality of blue diode chips 11c are bonded to a surface of the blue diode substrate 10c. The blue diode substrate 10c functions as the first substrate of embodiment 1. Then, a laser spot 12 generated from a laser energy source is applied in order to reduce a bonding force between the selected blue diode chip 111c and the surface of the blue diode substrate 10c, so as for the selected chip 111c to be released from the blue diode substrate 10c and transferred to the second substrate 13 with a built-in circuit. Referring to FIGS. 6, 7 and 8, the selected red diode chip 111a, selected green diode chip 111b and selected blue diode chip 111c are spaced apart from each other, such that the selected red diode chip 111a, selected green diode chip 111b and selected blue diode chip 111c are sequentially arranged on the second substrate 13.

In embodiment 4, the light-emitting diode chips to be released are selected according to an equal intervening distance therebetween, but the present disclosure is not limited thereto. In a variant embodiment of the present disclosure, persons skilled in the art select the light-emitting diode chips to be released, as needed.

The method of manufacturing a light-emitting device according to embodiment 4 entails repeating the process flow of the method of embodiment 1 three times to produce a light-emitting device with red, green and blue diode chips, but the present disclosure is not limited thereto. In a variant embodiment, the process flow of the method of embodiment 1 is carried out only once to transfer the selected light-emitting diode chip to the second substrate with a built-in circuit.

In another embodiment, the light-emitting device is repaired with the method of embodiment 1, by following the steps: checking out the positions and/or types of defects found in the light-emitting device to be repaired; creating a defect mapping; selecting, according to the defect mapping, a light-emitting diode chip to be released; and transferring the selected light-emitting diode chip to the defect position in the light-emitting device to be repaired. In a variant embodiment, the light-emitting device is repaired, by following the steps: transferring, according to the defect mapping, the selected light-emitting diode chip to a transfer substrate; and transferring the light-emitting diode chips distributed in accordance with the defect mapping and disposed on the transfer substrate to the defect positions in the light-emitting device to be repaired.

In conclusion, a method of selectively releasing a light-emitting diode chip according to the present disclosure is effective in releasing a selected light-emitting diode chip quickly and precisely through a coverage of a specific laser spot. The present disclosure further provides a method of manufacturing a light-emitting device to precisely release, with the method of selectively releasing a light-emitting diode chip, a selected light-emitting diode chip precisely during a production and/or repair process in the course of manufacturing the light-emitting device, so as to enhance the efficiency of manufacturing the light-emitting device.

The above-mentioned embodiments only exemplify the present invention, but are not used to limit the present invention. Persons skilled in the art can modify and change the above-mentioned embodiments without departing from the spirit and scope of the present invention. Therefore, the scope of protection of the rights of the present invention should be as stated in the claims of patent application described later.

What is claimed is:

1. A method of releasing a selected light-emitting diode chip from a plurality of light-emitting diode chips each of which has a p-type electrode, an n-type electrode and a central portion between the p-type electrode and the n-type electrode, comprising steps of:
   providing a first substrate with the plurality of light-emitting diode chips bonded thereon and spaced from each other in a pitch; and
   applying a laser spot generated from a laser energy source to reduce a bonding force between the selected light-emitting diode chip and the first substrate, thereby making the selected light-emitting diode chip release from the first substrate;
   wherein the laser spot has a coverage over the p-type electrode and the n-type electrode of the selected light-emitting diode chip, and the coverage has a length less than the pitch,
   wherein the laser spot is in a form of two spots, and
   wherein the two spots cover the p-type electrode and the n-type electrode of the selected light-emitting diode chip, respectively.

2. A method of releasing a selected light-emitting diode chip from a plurality of light-emitting diode chips each of which has a p-type electrode, an n-type electrode and a central portion between the p-type electrode and the n-type electrode, comprising steps of:
   providing a first substrate with the plurality of light-emitting diode chips bonded thereon and spaced from each other in a pitch; and
   applying a laser spot generated from a laser energy source to reduce a bonding force between the selected light-emitting diode chip and the first substrate, thereby making the selected light-emitting diode chip release from the first substrate;
   wherein the laser spot has a coverage over the p-type electrode and the n-type electrode of the selected light-emitting diode chip, and the coverage has a length less than the pitch,
   wherein the laser spot is in a form of three spots, and
   wherein the three spots cover the p-type electrode, the n-type electrode and the central portion of the selected light-emitting diode chip, respectively.

* * * * *